(12) United States Patent
Burns et al.

(10) Patent No.: US 8,137,893 B2
(45) Date of Patent: Mar. 20, 2012

(54) CHEMICAL TRIM OF PHOTORESIST LINES BY MEANS OF A TUNED OVERCOAT

(75) Inventors: Sean David Burns, Armonk, NY (US); Matthew E. Colburn, Armonk, NY (US); Steven John Holmes, Armonk, NY (US); Wu-Song Huang, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/983,297

(22) Filed: Jan. 1, 2011

(65) Prior Publication Data
US 2011/0129652 A1    Jun. 2, 2011

Related U.S. Application Data

(63) Continuation of application No. 12/137,743, filed on Jun. 12, 2008, now Pat. No. 7,862,982.

(51) Int. Cl.
| G03F 7/00 | (2006.01) |
| G03F 7/004 | (2006.01) |
| G03F 7/40 | (2006.01) |

(52) U.S. Cl. ............... 430/270.1; 430/311; 430/312; 430/317; 430/318; 430/322; 430/300; 430/331

(58) Field of Classification Search ............... 430/270.1, 430/273.1, 311, 312, 330, 331, 322, 317, 430/318
See application file for complete search history.

(56) References Cited

U.S. PATENT DOCUMENTS

| 4,591,547 A | 5/1986 | Brownell ...................... 430/312 |
| 5,741,625 A | 4/1998 | Bae et al. ..................... 430/312 |
| 5,942,369 A | 8/1999 | Ota et al. ...................... 430/192 |
| 6,015,650 A | 1/2000 | Bae ............................. 430/314 |
| 6,180,320 B1 | 1/2001 | Saito et al. .................... 430/311 |
| 6,448,097 B1 | 9/2002 | Singh et al. ..................... 438/16 |
| 6,492,075 B1 | 12/2002 | Templeton et al. .............. 430/5 |
| 6,861,209 B2 | 3/2005 | Li et al. ......................... 430/325 |
| 6,916,594 B2 | 7/2005 | Bok et al. .................. 430/270.1 |
| 7,310,797 B2 | 12/2007 | Huckaby ......................... 716/21 |
| 7,338,750 B2 | 3/2008 | Kozawa et al. ............... 430/314 |
| 7,455,952 B2 | 11/2008 | Hatakeyama et al. ..... 430/273.1 |
| 7,862,982 B2 * | 1/2011 | Burns et al. ................ 430/270.1 |
| 2006/0257749 A1 | 11/2006 | Chang et al. |

* cited by examiner

*Primary Examiner* — Amanda C. Walke
(74) *Attorney, Agent, or Firm* — Robert J. Eichelburg; The Law Offices of Robert J. Eichelburg (57) ABSTRACT

A new lithographic process comprises reducing the linewidth of an image while maintaining the lithographic process window, and using this process to fabricate pitch split structures comprising nm order (e.g., about 22 nm) node semiconductor devices. The process comprises applying a lithographic resist layer on a surface of a substrate and patterning and developing the lithographic resist layer to form a nm order node image having an initial line width. Overcoating the nm order node image with an acidic polymer produces an acidic polymer coated image. Heating the acidic polymer coated image gives a heat treated coating on the image, the heating being conducted at a temperature and for a time sufficient to reduce the initial linewidth to a subsequent narrowed linewidth. Developing the heated treated coating removes it from the image resulting in a free-standing trimmed lithographic feature on the substrate. Optionally repeating the foregoing steps further reduces the linewidth of the narrowed line. The invention also comprises a product produced by this process.

14 Claims, 11 Drawing Sheets

PITCH SPLIT: LITHO/ETCH - LITHO/ETCH

- MATERIALS/ PROCESS
  - FIRST LAYER
    - ODL63 AT 140 nm
    - SHB940 AT 35 nm
    - 2746 AT 105 nm
    - EXPOSE FELA PC AT 1.2 NA, QUASAR 30, .8/.6, 12.8 mj
    - LITHO TRIM OF 15 nm
  - ETCH FIRST LAYER INTO SiARC
  - SECOND LAYER
    - EB18 AT 52 nm
    - SHB940 AT 35 nm
    - 2746 AT 105 nm
    - EXPOSE FELA PPC AT 1.2 NA, QUASAR 30, .8/.6, 12.8 mj
      - ALIGN TO PC, 715 nm X OL OFFSET
    - LITHO TRIM OF 15 nm
  - ETCH SECOND LAYER INTO SiARC
  - TRANSFER COMBINED SiARC PATTERNS INTO EB18/ODL

CHEMICAL TRIM OF PHOTORESIST LINES BY MEANS OF A TUNED OVERCOAT

RELATED APPLICATIONS

This application is a continuation of application Ser. No. 12/137,743, filed Jun. 12, 2008 which is incorporated herein by reference in its entirety; application Ser. No. 12/137,743 having issued as U.S. Pat. No. 7,862,982.

FIELD OF THE INVENTION

The field of the invention comprises formation of fine line lithography patterns for the purpose of semiconductor fabrication.

BACKGROUND OF THE INVENTION AND RELATED ART

Historically, lithographic scaling has generally been achieved by means of increasing the numerical aperture available for optical exposure equipment, and by means of using shorter exposure wavelengths. At present, the industry has reached a condition in which it is no longer possible to economically increase numerical aperture or reduce the exposure wavelength. As a result, many alternative methods of scaling integrated circuit lithography are being investigated. One method involves the use of multiple exposures to form a single lithographic mask pattern on the wafer. The pitch of the pattern is split by interstitially placing a line from a second mask in between two lines formed by a first mask. The effective pitch of the resulting combined pattern can be twice as dense as that of a single pattern. This density enhancement can provide a path for continued device scaling. However, in order to gain this density, it is necessary to aggressively trim the linewidth printed at each layer. If a conventional overexposure of a positive resist film is used to trim the line, the process window becomes very small. We have developed an alternative method of trimming the linewidth such that the process window can be maintained without degradation during the trim. We have demonstrated the incorporation of our trim process into a pitch-split double-patterning scheme for the patterning of semiconductor circuits.

Chang et al., United States Patent Application Number 20060257749 A1 describe some of the problems associated with chemical trim processes such as submerging a patterned photoresist layer and the entire wafer substrate in a basic or neutral chemical solution which results in removal of a portion of the photoresist layer and causes a reduction in the "critical dimension." The exact reduction of the "critical dimension," however, is difficult to control which often results in over-trimming or removal of the photoresist layer. Moreover, after treatment with the chemical solution, the properties of the sidewalls of the photoresist change, which affect the etch resistance of the photoresist. Examination of the sidewalls by SEM after the etch will detect any significant damage, but the SEM process itself can also affect the etch resistance of the sidewalls.

Chang et al. also describe some difficulties using a plasma trim process in which a photoresist layer on semiconductor wafer is exposed to plasma etching to by means of ion bombardment to trim the layer in order to reduce the "critical dimension." Plasma trim processes usually result in undesirable line-end trimming that prevents maintaining a predetermined line length. Relatively long plasma trim processes also reduce the yield of useful photoresists, changes the properties of the exposed photoresist, and also results in having to redeposit photoresist material in adversely affected areas.

RELATED ART

The following references comprise related art teachings:

Finders et al., Double patterning lithography: The bridge between low k1 ArF and EUV, Microlithography World, http://sst.pennet.com/display_article/320379/28/ARTCL/none/none/1/Double-patterning-lithography . . . (Feb. 2008)

Huckabay, U.S. Pat. No. 7,310,797, Method and System for Printing Lithographic Images with Multiple Exposures.

Templeton, U.S. Pat. No. 6,492,075, Chemical Trim Process.

Capetti, et al., "Sub–k1=0.25 lithography with double patterning technique for 45 nm technology node flash memory devices.=193 nm, Proc. SPIE 6520, (2007);

Lee, et al., "Double Exposure Technology using Silicon Containing Materials", Proc SPIE 6153, (2006);

Pollentier, et al., Sub-50 nm gate patterning using line-trimming with 248 or 193 nm litho, Microlithography World, http://sst.pennet.com/articles/article_display.cfm?Section=ARCHI&C=Feat&ARTICLE_I . . . (May 2002)

Ramalingam, et al. Photoresist Trimming: Etch Solutions to CD Uniformity and Tuning, Semiconductor International, http://www.semiconductor.net/article/CA239573.html (Sep. 1, 2002).

The foregoing shows an industry need for processes for trimming the linewidth of lithographic images such that the process window can be maintained without degradation during the trim. It also shows a need for such a line trim process in a pitch-split double-patterning scheme for the patterning of semiconductor circuits.

Accordingly, the present invention provides such processes that address these needs to not only provide advantages over the related art, but also to substantially obviate one or more of the foregoing and other limitations and disadvantages of the related art, such as maintaining the process window during line trim which cannot be readily achieved with conventional methods such as over-exposure of a positive resist film. The written description, claims, abstract of the disclosure, and the drawings, that follow set forth various features, objectives and advantages of the invention and how they may be realized and obtained. They will also become apparent by practicing the invention.

We have developed an alternative method of trimming the linewidth such that the process window can be maintained without degradation during the trim. We have demonstrated the incorporation of our trim process into a pitch-split double-patterning scheme for the patterning of semiconductor circuits.

To achieve these and other advantages, and in accordance with the purpose of the invention as embodied and broadly described herein, the invention comprises a novel process for the chemical trim of photoresist lines by means of a tuned overcoat material.

The overcoat is tuned to the resist in the sense that the acidic properties of the overcoat are suitable for cleaving the active sites on the resist during the post apply bake process. Too strong an acid will cause too much activation of the resist, and too much consequent reduction in linewidth. Too weak an acid will not provide sufficient activation of the resist to provide enough reduction in the resist linewidth. The tuning can occur by choice of bake temperature, choice of bake time, and/or number of repetitions of the trim process. The amount of trim can also depend on the choice of resist material and the choice of topcoat material. Generally the carboxylic acid is not strong enough to induce the trim, sulfonic acids are more effective, but this depends on the resist choice and the bake temperature. The carboxylic acid might serve as a means of controlling the percentage of sulfonic material. That is, the carboxylic acid provides good solubility properties in developer and good polarity in terms of avoiding mixing the topcoat with the resist layer, but does not add that much to the trim. The sulfonic acid can be added in smaller percentages relative to the carboxylic acid, to provide the necessary acid strength to drive the reaction, but not providing so much activity that the bulk of the resist is removed during the trim. Too much trim is undesirable, as it will degrade the resist pattern rather than simply reduce the linewidth.

The typical resist polymers of chemically amplified positive tone resists usually contain at least one acid labile moiety as the reactive site toward photo generated acids. The common acid labile groups are acetals, ketals, carbonates, tertiary esters. One typical example of these reactive sites can be represented with the ester group such as —(CO)—O—R. R can be cleaved with an acid to form carboxylic acid, thus rendering the resist polymers soluble in aqueous base. Examples of these R substituents include tetrahydropyranyl (THP), tetrahydrofuranyl (THF), 1-ethoxyethyl, 1-methoxycyclohexyl, and 1-methoxypropyl. In common 193 nm resist polymers, the R substituents are usually hydrocarbyl substituents having a tertiary carbon attachment point, these substituents may be either cyclic (including alicyclic) or acyclic. Such substituents include, without limitation, t-butyl, adamantyl, norbornyl, isobornyl, 2-methyl-2-adamantyl, 2-methyl-2-isobornyl, 2-methyl-2-tetracyclododecenyl, 2-methyl-2-dihydrodicyclo-pentadienyl-cyclohexyl, 2-ethyl-2-adamantyl, 2-ethyl-2-isobornyl, 2-ethyl-2-tetracyclododecenyl, 2-ethyl-2-dihydrodicyclo-pentadienyl-cyclohexyl, 1-methylcyclopentyl, 1-methylcyclohexyl, 1-methylcycloheptyl, 1-methylcyclooctyl, 1-ethylcyclopentyl, 1-ethylcyclohexyl, 1-ethylcycloheptyl, 1-ethylcyclooctyl. The reactivity of these reactive sites varies with the structures of the R group. Low activation acid labile groups such as acetals and ketals are very easy to get cleaved by acid, thus the cleavage could occur even at room temperature. The tertiary ester groups containing 2-methyl-2-admantyl and 2-methyl-2-norbonyl are usually relatively higher activation and harder to cleave by acids, and generally require higher temperature such as about 120° C. or greater for more efficient cleavage. In the tertiary ester groups, 1-ethylcyclopentyl and 1-ethylcyclooctyl groups are relatively lower activation but not as low as acetals and ketals, thus would require only a lower temperature bake in the range of about 60-120° C. in the presence of acids. The acids used in cleaving these reactive sites are usually sulfonic acids such as perfluorobutanesulfonic acids generated by exposing the photoacid generators. Commercially available resists, such as JSR 2073, JSR 2746, Shin-Etsu 2154 and Shin-Etsu 4157 may contain at least one of the above disclosed reactive sites in the resist polymers. A typical 193 nm resist polymer usually also contains a lactone moiety to control the polarity and dissolution properties of the resist. Examples of lactones moieties include 5-methacryloyloxy-2,6-norbornanecarbo-γ-lactone, 3-methacryloyloxymethyl-2,6-norbornanecarbo lactone, 3-acryloyloxymethyl-2,6-norbornanecarbo lactone, α-acryloyloxy-γ-butyrolactone, α-methacryloyloxy-γ-butyrolactone, α-acryloyloxy-γ-butyrolactone and α-methacryloyloxy-γ-butyrolactone. Some resists could contain a solubility promoting moiety not protected by acid labile group. Examples of solubility promoting moieties include carboxylic acids, sulfonamides, fluorinated sulfonamides, fluoroalcohols (e.g., moieties having both —OH and —$CF_3$ groups), dicarboxylmides, N-hydroxy dicarboxylmides, phenol, amino and imino groups.

There are many factors that affect the trimming rate during the trimming process. The trimming process is an acid catalyzed cleavage of the acid labile group of the resist polymer by the acid of the trimming polymer coated over the resist images. The structure of the resist polymer could affect the trimming rate, such as the active sites containing lower activation energy groups that would have a faster trimming rate than high activation energy ones. The polymer structure containing more acidic solubility promoting groups such as carboxylic acids, fluorosulfonamides and fluoroalcohols, would create acidic environments near the active sites and then would render the active sites easier to be cleaved by acids. The structure of the trimming polymer would also affect the trimming rates. The trimming polymers used in this invention contains acidic moieties on the side chain of the polymers. Examples of the acidic moieties are sulfonic acids, carboxylic acids, fluorocarboxylic acids or fluoroalkanesulfonic acids. Fluoroalkalkanesulfonic acids, such as perfluorooctane sulfonic acids are stronger acid than regular sulfonic acids, thus they would provide fast trimming rates than those of regular sulfonic acids. Carboxylic acids are very weak acids would not have sufficient acidic strength to cleave regular acid labile moieties except acetals and ketals. The trimming polymers may also contain base soluble moieties in addition to the above described acidic moieties. Examples of these base soluble moieties are sulfonamides, fluorinated sulfonamides, fluoroalcohols (e.g., moieties having both —OH and —$CF_3$ groups), dicarboxylmides, N-hydroxy dicarboxylmides, phenol, amino and imino groups.

Baking temperature and time are two other major factors in controlling the amount of trimming.

In one aspect, the present invention comprises a lithographic line-trim process for reducing the linewidth of an image on a substrate while maintaining the lithographic process window. The lithographic process window comprises the range of focus and expose latitude over which the resist provides image size values within the desired range. A wider range of focus and expose latitude is desirable in order to provide superior linewidth control within chip, within wafer, and wafer to wafer, in a production process.

BRIEF DESCRIPTION OF THE DRAWINGS

The accompanying Figures, incorporated into this specification, together with the detailed description herein serve to further illustrate various embodiments and to explain various principles and advantages of the present invention.

FIG. 3 plots EL(AU) as the ordinate and depth of field (DOF) as the abscissa.

DETAILED DESCRIPTION OF THE INVENTION

To achieve these and other advantages, and in accordance with the purpose of this invention as embodied and broadly described herein, the following detailed embodiments comprise disclosed examples that can be embodied in various forms.

The specific processes compounds, compositions, and structural details set out herein not only comprise a basis for the claims and a basis for teaching one skilled in the art to employ the present invention in any novel and useful way, but also provide a description of how to make and use this invention.

More specifically, the process of the invention comprises a lithographic line-trim process for reducing the linewidth of an image on a substrate while maintaining the lithographic process window, comprising the steps of:

(a) applying a lithographic resist layer on a surface of a substrate and patterning and developing the lithographic resist layer to form a nm order node image having an initial line width. A nm order node image in this regard comprise a node anywhere from about 45 nm to about 5 nm; or about 32 nm to about 10 nm; or about 22 nm to about 15 nm;

(b) Overcoating the nm order node image with an acidic polymer to produce an acidic polymer coated image;

(c) heating the acidic polymer coated image to produce a heat treated coating on the image, the heating being conducted at a temperature and for a time sufficient to reduce the initial linewidth to a subsequent narrowed linewidth;

(d) developing the heated treated coating to remove the acidic polymer and produce a free-standing trimmed lithographic feature on the substrate;

(e) optionally repeating at least steps (b) to (d) to further reduce the line width of the narrowed linewidth.

The invention further comprises a product made by a lithographic line-trim process for reducing the linewidth of an image on a substrate while maintaining the lithographic process window, comprising the steps of:

(a) applying a lithographic resist layer on a surface of a substrate and patterning and developing the lithographic resist layer to form a nm order node image having an initial linewidth;

(b) overcoating the nm order node image with an acidic polymer to produce an acidic polymer coated image;

(c) heating the acidic polymer coated image to produce a heat treated coating on the image, the heating being conducted at a temperature and for a time sufficient to reduce the initial linewidth to a subsequent narrowed linewidth; and (d) developing the heat treated coating to remove the acidic polymer and produce a free-standing trimmed lithographic feature on the substrate;

(e) wherein the substrate is operatively associated with a hard mask material and the image comprises a first lithographic layer operatively associated with the hard mask material, and etching the first lithographic layer into the hard mask material and repeating the steps (a) to (d) to apply a second lithographic layer in a manner to form a pitch-split pattern on the substrate; the line-trim process producing a focus/expose process window having an expose latitude greater than the expose latitude obtained with an overexpose process. In another embodiment, the product the substrate comprises a surface of a semiconductor device.

In a further embodiment, the product produced by the process of the invention comprises forming a nm order node image as set out in paragraph above wherein the lithographic resist layer comprises a first lithographic resist layer, followed by repeating the steps (a) to (d) also set out in paragraph above, to apply a second lithographic resist layer in a manner to form a pitch-split image, wherein the process excludes an etching step.

In another embodiment, the product produced by the process of the invention comprises forming a nm order node image as set out in paragraph above wherein the lithographic resist layer comprises a first lithographic resist layer, followed by repeating the steps (a) to (d) set out in paragraph above to apply a second lithographic resist layer dissolved in a solvent comprising at least one alkanol having 1 to about six carbon atoms, the second lithographic resist layer being applied in a manner to form a pitch-split image, wherein the process excludes an etching step.

The process of the invention includes the use of polymers wherein at least one of the acidic polymers or the lithographic resist layers comprises acidity enhancing electron withdrawing groups, such as a those comprising a sulfur-containing acidic moiety. In a further embodiment, these polymers have an ethylenic backbone, such as those comprised of monomeric units selected from vinyl, or acrylates, or methacrylates and combinations thereof.

In another embodiment of the invention, at least one of the acidic polymers or the lithographic resist layer includes at least one monomeric unit having a structure selected from:

wherein R is Cl, F, Br, I, $CCl_3$, $CF_3$, $CBr_3$, CN, NO, or $NO_2$; or wherein at least one of the acidic polymer or the lithographic resist layer further comprises a halogen, cyano, or nitro-containing carboxylic acid moiety.

In one embodiment of the step (c) heating, we conduct the heating at a temperature of from about 60° to about 250° C., or about 120° to about 150° C. These conditions vary depending depends on the resist polymer and the overcoat polymer. For example, one resist is baked at 75 C for the trim step (ShinEtsu 4157), one at 120 C for the trim step (JSR 2073), one at 110 C (ShinEtsu 2154), and one at 150 C for the trim (JSR2746), all using the same overcoat material, TCX041 from JSR. TCX 041 is a commercially available material, generally used as a barrier film between photoresist and the immersion fluid in an immersion lithography system. It is comprised of an acidic fluorocarbon polymer.

Further in this regard, other polymers used in the process of the invention comprise ShinEtsu 4157, JSR 2073, ShinEtsu 2154, and JSR2746.

The standard developer used in the developing step (d) comprises a developer used in the semiconductor industry, 0.26 N TMAH (tetramethylammonium hydroxide) in an aqueous solution. We generally use this developer without surfactant, but some formulations might use a surfactant to improve surface wetting but at the penalty of more defects. We typically develop for 30 sec, but develop times of 5 sec to 60 sec could be used. The process is carried out at ambient temperature, i.e., about 20-22 C. Develop is-generally accomplished by formation of a "puddle" of developer solution on the wafer, or sometimes by a dynamic flush while rotating the wafer. Developer is removed by rinsing with water when the process is complete, and then spinning the wafer to dry.)

The substrate employed in the process may comprise the surface of a semiconductor device. Also, the substrate can be operatively associated with a hard mask material. The hard mask can exist as a film directly on the silicon surface, applied by chemical vapor deposition, and comprises silicon oxide, silicon nitride, amorphous silicon, titanium nitride, tantalum nitride, tungsten, or germanium or combinations thereof. More typically, the hard mask comprises a spin-applied layer of a film containing hydrocarbons and silicon, i.e., a polysilane.

The silicon layer is generally spin applied over a layer of a hydrocarbon polymer. The thickness of the hydrocarbon layer is typically about 50 to about 250 nm, while the polysilane layer is typically about 20 to about 100 nm thick. The resist is spin-applied over the polysilane layer, exposed and developed. The resist pattern is then etched into the polysilane layer, for which highly selective RIE processes have been established. The pattern from the polysilane film is then transferred by RIE into the hydrocarbon underlayer, resulting in a high aspect ratio pattern, which can then be used to transfer the pattern into the silicon wafer. The polysilane has a high aspect ratio relative to the organic underlayer, allowing a thin polysilane layer to be used to create the high aspect ratio pattern in the organic underlayer.

The optical properties of the polysilane and the organic underlayer are generally engineered such that they behave as anti-reflective coatings during the exposure of the resist pattern. In another embodiment some films use titanium rather than silicon in the hard mask layer immediately under the resist.

The image comprises a first lithographic layer operatively associated with the hard mask material where the first lithographic layer is etched into the hard mask material. The resist is spin-applied over the hard mask, and the hard mask is spin applied over the organic underlayer, which is also created by spin-apply.

The resist pattern is etched into the hard mask using an RIE process. Generally, the hard mask can be etched with fluorocarbon plasma chemistry, while the resist is somewhat resistant to the fluorocarbon plasma. In this way, the hard mask can be removed while minimal plasma degradation of the resist occurs. When the hard mask layer is etched into the organic underlayer, oxygen plasma chemistry is generally used, such that the hard mask exhibits very low etch rates, while the organic underlayer has a high etch rate. In this way, a thin hard mask can serve as a mask for image transfer through a thick layer of organic underlayer. We then repeat steps (a) to (d) to apply a second lithographic layer in a manner to form a pitch-split pattern on the substrate.

Another embodiment comprises a process of forming a nm order node image as broadly described above wherein the lithographic resist layer comprises a first lithographic resist layer, followed by repeating the steps (a) to (d) to apply a second lithographic resist layer in a manner to form a split-pitch image, wherein the process excludes an etching step.

The invention also comprises a further embodiment wherein a nm order node image is formed according to the process broadly described above wherein the lithographic resist layer comprises a first lithographic resist layer, followed by repeating the steps (a) to (d) to apply a second lithographic resist layer dissolved in a solvent comprising at least one alkanol having 1 to about six carbon atoms.

The alkanol in this regard comprises any straight chain or branched chain alkyl alcohol having from 1 to about 6 carbon atoms or more, those are well known in the art, and contain 1 to about 2 hydroxy groups and include mixtures of any of these alcohols. In one embodiment the alkanols comprise four carbon or five carbon alkanols. In the foregoing embodiments, the second lithographic resist layer is applied in an art-known manner to form a split-pitch image, wherein the process excludes an etching step.

The present invention also comprises a product made by any of the processes described above.

Figure 1:
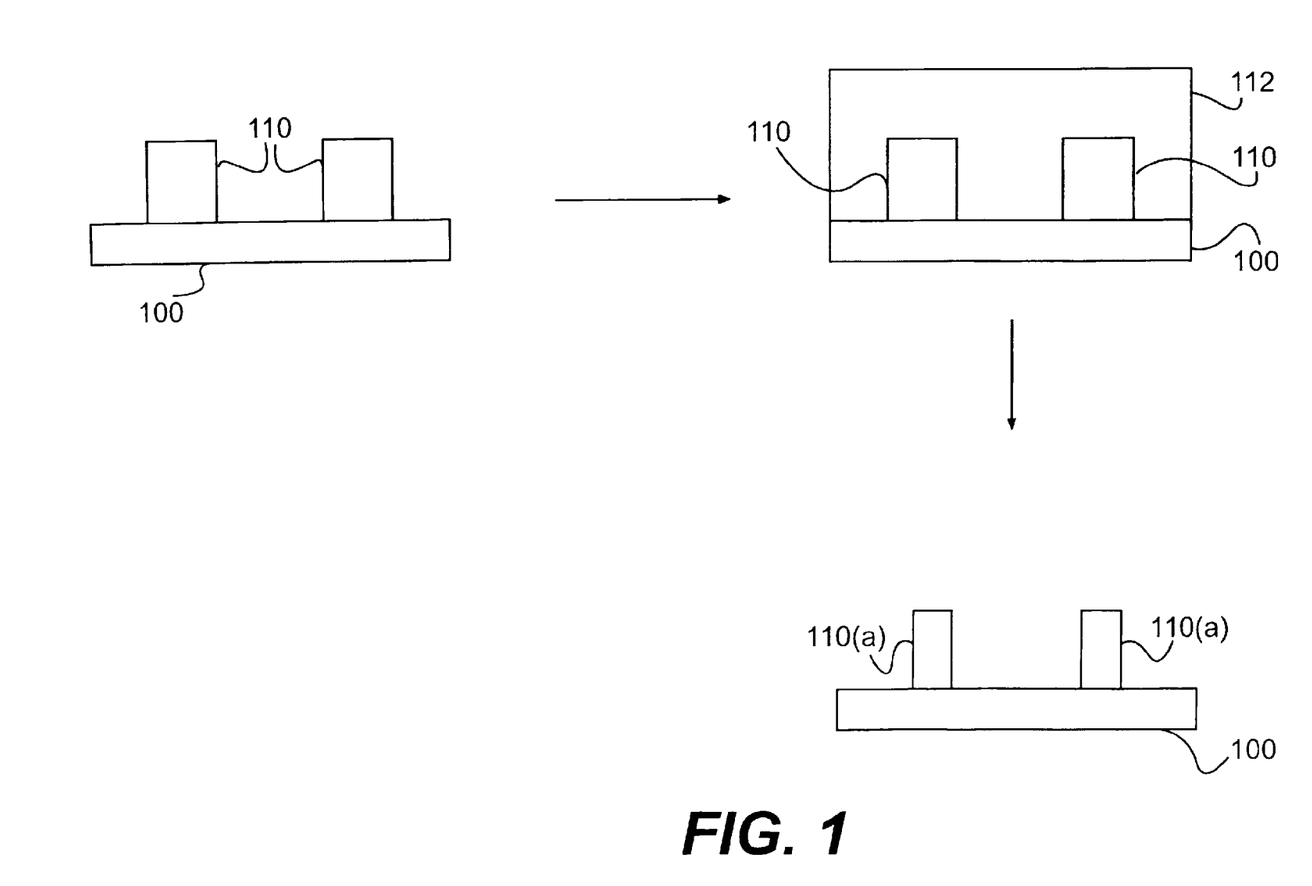
FIG. 1. comprises a schematic diagram of the Line Trim Process Flow.

Thus, the present invention comprises novel processes for the chemical trim of photoresist lines by means of a tuned overcoat material which can be understood by reference to the various Figures in which FIG. 1 comprises a schematic diagram for the process flow of our invention. First, a photoresist pattern is formed on a substrate, such as a silicon wafer, using conventional expose methods and materials. After the photoresist has been developed, a suitable overcoat material, such as TCX041 from JSR, is applied by spin-coating over the resist pattern and then baked. In FIG. 1, a substrate 100 is coated with conventional resist 110, e.g., JSR 4157, JSR 2746, JSR2073, and developed to form a line pattern 110 having a fixed linewidth as indicated. This is followed by baking at about 150 C for about 60 sec. resulting in a trimmed resist line 110(*a*) in which the linewidth of 110 is reduced to the linewidth illustrated as 110(*a*) which represents a trim of the linewidth of 110 to anywhere from about a 5 nm trim to about a 50 nm trim depending on process conditions and the resist.

During the bake step, an interaction can occur between the photoresist and the overcoat film, such that the surface layer of the photoresist becomes activated to further develop. After the bake step, a second conventional develop process is performed, which removes the overcoat and at the same time removes a thin surface layer from the photoresist.

Figure 2:
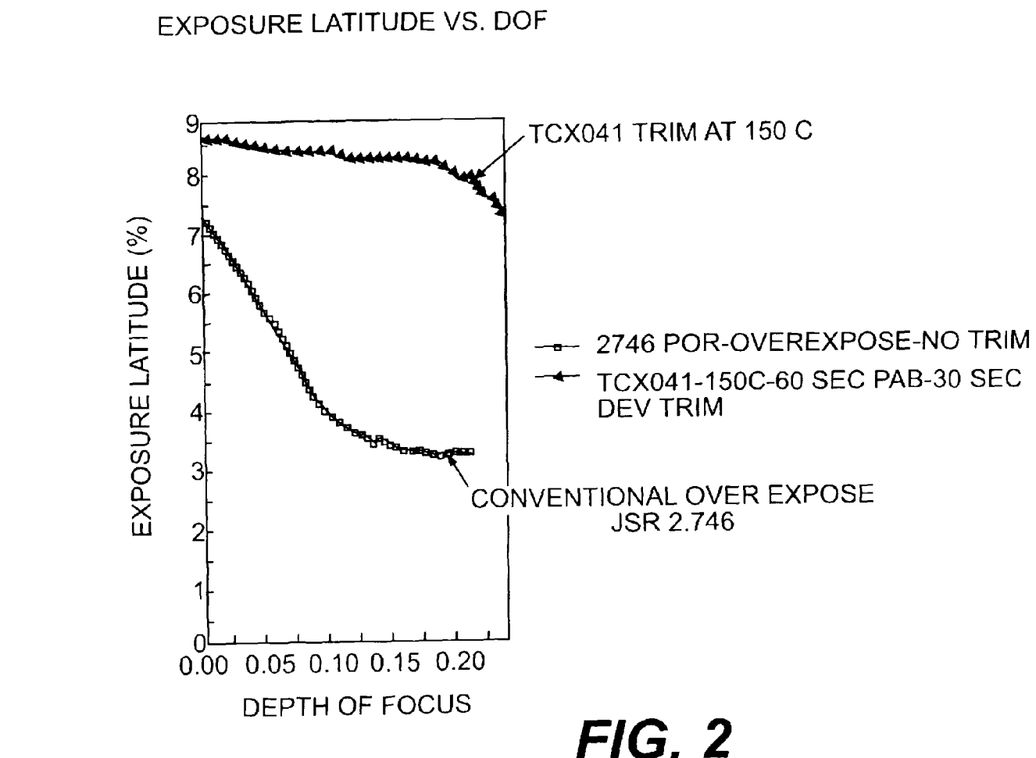
FIG. 2 comprises a comparison of process windows plotting exposure latitude (%) (the ordinate) against depth of focus (the abscissa) for the Line Trim process vs. an over-exposure method of reducing linewidth.

FIG. 2 plots data from procedures that generally follow the process described in FIG. 1 and comprises a focus/expose process window comparing a conventional overexpose process to our line-trim process for a 28 nm resist line at a 150 nm pitch. With the conventional process, an expose latitude of 3.5% is attained at a depth of focus of 0.20 um, while for the line trim process, the expose latitude is roughly doubled, at 7.5% for a 0.20 um depth of focus. This process window advantage is a key benefit of our invention.

As noted previously FIG. 2 comprises a comparison of process windows plotting exposure latitude (%) (the ordinate) against depth of focus (the abscissa) The exposure latitude is calculated from a model created from the raw data. We use a 10% variation in linewidth as the metric to determine the boundary for the exposure latitude, i.e., the chart shows the exposure variation which can be tolerated for the image while maintaining the image size within 10% of the target linewidth. The focus and expose latitude are inter-related, i.e., as more focus variation is allowed, then the allowed range for exposure is reduced. A larger process window provides a more manufacturable lithographic process for the Line Trim process vs. an over-exposure method of reducing linewidth using the JSR 2746 resist. The TCX041 trim noted in FIG. 2 is employed according to the method of the invention. FIG. 2 plots data obtained according to the method of the present invention with 193 nm exposures and with the depth of focus reported in microns.

The "resist CD" at the top of FIG. 2 comprises the image size of the resist line, which in this case comprises a target linewidth of 28 nm at a 150 nm pitch. The terms in FIG. 2, "no trim" refers to the conventional process, which had no trim. In the designation "PAB-30 sec dev trim" PAB refers to the Post Apply Bake for the overcoat material, and 30 sec develop refers to the develop time used to remove the overcoat during the trim step.

Figure 3:
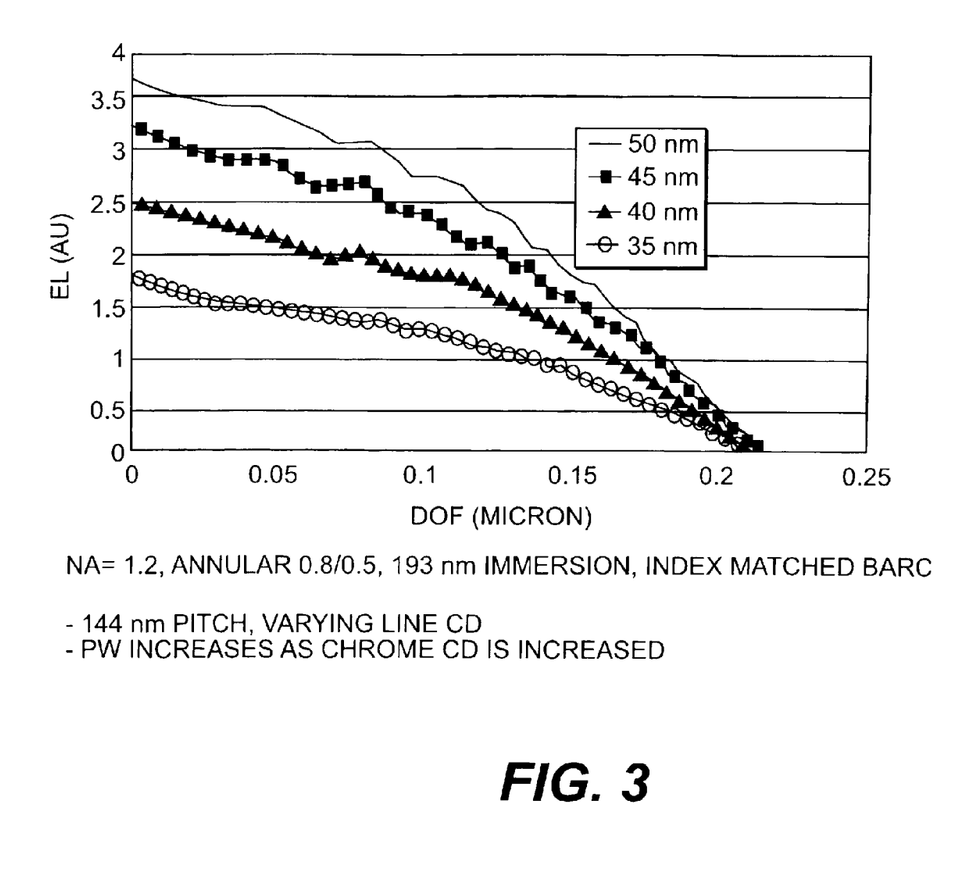
FIG. 3 comprises a plot showing a process window for linewidth reduction by means of over-exposure, as calculated from a physical model of the exposure process.

FIG. 3 plots data from procedures that generally follow the process described in FIG. 1 and comprises some modeled process window results, which show that for a conventional overexposure process, one would expect to find that the process window decreases as the overexposure increases. Our invention allows us to avoid overexposure, while at the same time achieving smaller linewidths.

In FIG. 3 the term "EL(AU)" refers to exposure latitude ("EL"), which was calculated from a model, and AU means, a type of normalized unit related to the model. In the term "NA=1.2," NA is Numerical Aperture of the exposure tool, which is a key characteristic related to the resolution capability of the optical system. The term "Annular 0.8/0.5" refers to the type of illumination setting used in the phototool known in the art, in which the aperture of the tool is a circular ring of clear area in a background that blocks the light, 0.8 refers to the outer dimension of the ring, and 0.5 refers to the inner dimension of the clear ring. The illumination needs to be chosen such that it is optimum for a particular feature type, e.g., line/space, pitch, contact hole and the like. The measurements, 50 nm, 45 nm, 40 nm, and 35 nm refer to linewidths.

The process employed 193 nm immersion exposure in contrast to dry exposure. In dry exposure, air is the material between the lens and the wafer, in immersion exposure there is a layer of water between the optics and the wafer, which allows higher NA values to be achieved due to better matching of the refractive index between the resist layer, the optics material, and the layer between the two.

This exposure also employed an index matched BARC. i.e., the index of refraction of the BARC is substantially matched to the index of refraction of the resist in order to optimize reflectivity control. In addition, the exposure involved varying line CD, where a resist line was modeled, rather than employing a space or contact hole. CD refers to Critical Dimension. In FIG. 3, PW increases as chrome CD is increased; which is to say the focus exposure latitude in the resist generally increases as the chrome line width on the mask is increased. "Chrome" refers to a thin layer of material on the photo mask which serves to block the exposure from portions of the wafer. Resist areas under the chrome remain unexposed. The term "PW" is an acronym for Process Window, or focus/exposure latitude capability.

Figure 4:
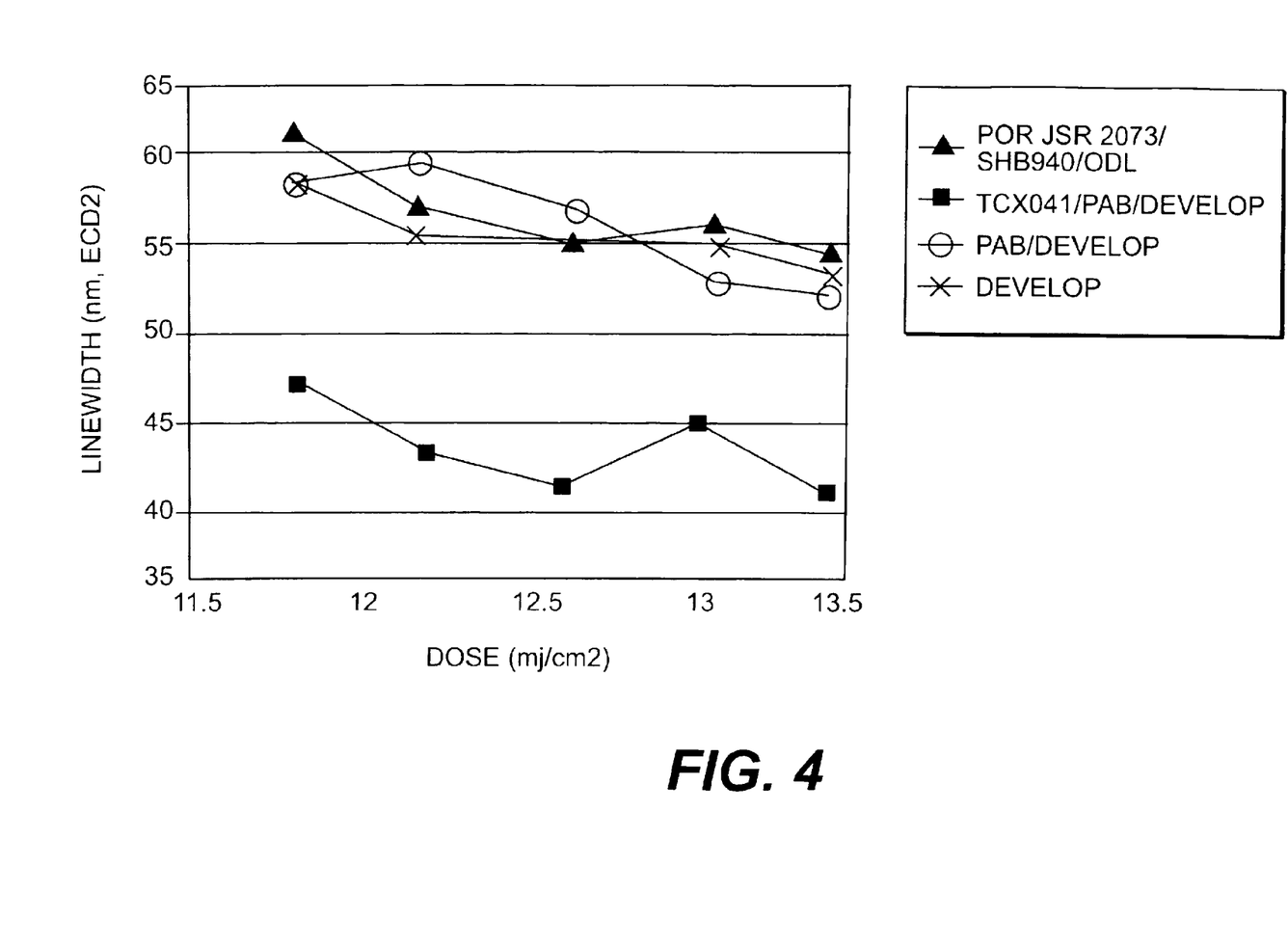
FIG. 4 comprises a plot illustrating the experimental characterization of the line trim amount for a commercially available photoresist, JSR 2073, with Linewidth as the ordinate and Dose as the abscissa.

The process employed to produce the data reported in FIG. 3 illustrates the advantage of a post litho line trim to maintain good PW, i.e., the results indicate that by using a larger mask chrome size, and printing a larger resist linewidth, followed by trimming the line with the overcoat process of the invention, we obtain a substantially better overall process window than using a smaller chrome linewidth and printing a small resist linewidth directly without the use of a trim. This trend is based on the optical aerial image behavior at small CD, and is independent of resist type FIG. 4 plots data from procedures that generally follow the process described in FIG. 1 and comprises some line-trim results for a commercially available resist, JSR 2073, using a JSR immersion topcoat as the material for inducing the linetrim. There is about a 13 nm reduction in linewidth achieved by means of coating the topcoat over the previously exposed and developed resist pattern, followed by a bake step (120 C for 60 seconds in this case), and another develop of 30 seconds with 0.26 N TMAH. If the additional bake and/or develop is performed in the absence of the topcoat material, the linewidth remains unchanged, indicating that the linewidth reduction is caused by the interaction of the acidic surface of the topcoat material with the resist surface.

FIG. 4 employs terms defined as follows:

"POR" refers to the standard process of record, with organic underlayer at 200 nm thickness, silicon anti-reflective coating at 35 nm, and resist at 145 nm, and topcoat TCX041 at 90 nm.

"TCXO41/PAB/Develop" refers to the process used for the trim of the line, which a 90 nm TCX041 coating, baked t at the specified bake temperature, and developed. This process took place after exposing and developing the resist pattern.

"PAB Develop" omitted the application of TCX041 during the trim process, and only added a bake step and a develop step. No change in linewidth was observed, indicating that the TCX041 material in one embodiment of the invention is essential to obtain the trim in the linewidth.

"Develop" omitted both the TCX041 and bake during the trim step, and only added the develop step. This process also showed no trim in the final resist linewidth.

The data of FIG. 4 were generated using an ECD2 SEM device manufactured by KLA-Tencor, to show resist line trim with post develop processing. FIG. 4 shows the results when using three post develop processing modes wherein one had the overcoat, with a post apply bake, and a develop step. FIG. 4 also shows the results using splits without the overcoat, using just a PAB and develop, or just an added develop. These added process steps did not result in reduced resist linewidth unless the overcoat material was present, indicating that the interaction between the overcoat and the resist was a key aspect of the process in order to achieve the desired line trimming.

FIG. 4 plots data using a SHB 940/ODL process based on materials from Shin Etsu. The trade name SHB940 refers to the layer directly under each of the resists, and serves as both a hard mask and an ARC layer. The trade name ODL is an organic underlayer, i.e., a hydrocarbon, which is used to create the final mask on the wafer prior to RIE of the silicon. The SHB940 contains silicon, and is about 35 nm thick, while the ODL is about 100 to about 200 nm thick.

"POR" refers to process of record, which is a standard process without any trim, and "PAB," Post Apply Bake, which is a step performed after spin application of a material, generally to remove casting solvent and sometimes to drive cross-linking of a material such as a BARC.

As previously noted, "TCX041" is the trade name for the overcoat material from JSR, which was used as a trim material. It is normally used as a topcoat layer over resist during the immersion expose process, in order to avoid intermixing between the immersion fluid, which is water, and the resist. Imaging problems can result if such intermixing occurs, either damage to the resist pattern, or also damage to the optics of the exposure tool from chemicals leached out of the resist.

The "Develop" process comprises the steps in which the exposed resist is removed from the wafer surface. Generally, we dispense 0.26 N TMAH aqueous developer onto the wafer surface to form a puddle of developer. The developer is allowed to stand on the wafer for a period of time, then spun off, and the wafer is rinsed with water, and then spun dry. All FIG. 4 data are based on 193 nm exposures at the exposure dose listed on the X axis.

Figure 5:
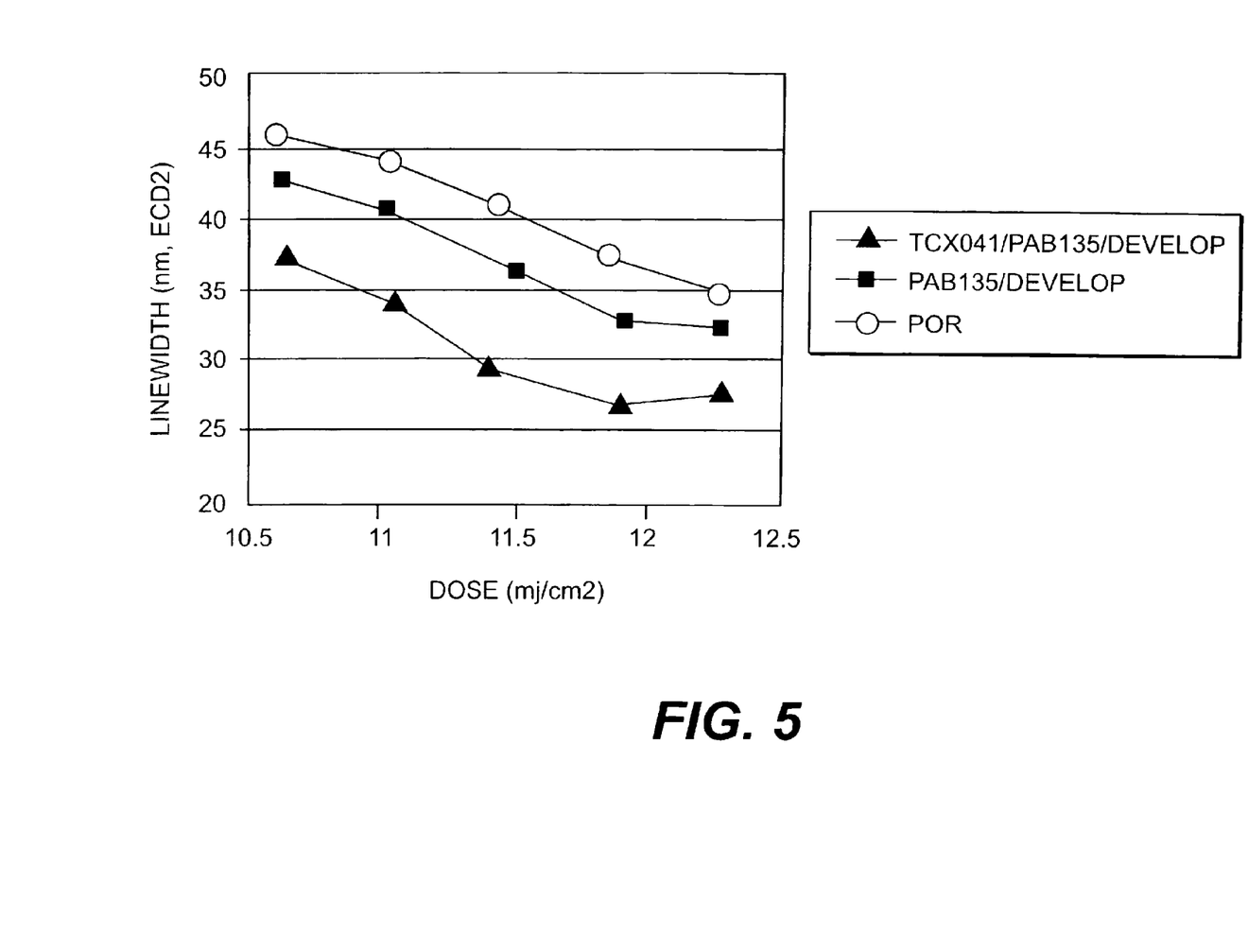
FIG. 5 comprises a graph showing experimental characterization of the line trim amount for another resist, JSR 2746.

FIG. 5 plots data from procedures that generally follow the process described in FIG. 1 and comprises some similar data for another JSR resist, 2746, used in combination with SHB940 and ODL as described above with reference to FIG. 4. This resist is used under each of the top coats used in the trim process for the data reported in FIG. 5. In this case, the resist is trimmed by about 9 nm by means of the TCX041 overcoat material. Unlike the 2073 example of FIG. 4, the 2746 resist experiences some line-trim, about 2-3 nm, with an added bake and develop even in the absence of the topcoat. In FIG. 5, "PAB135" refers to the bake that was conducted after the initial develop of the 2746 pattern, at 135 C for 60 seconds, with an additional 30 sec develop step. The overcoat material was observed to provide more trim than the added bake and develop without the overcoat. The terminology employed in FIG. 5 has the same meaning as in FIG. 4. The term "135" employed in the designations "TCXO41/PAB135/Develop" and "PAB135/Develop" refer to a PAB temperature of 135 C.

Figure 6:
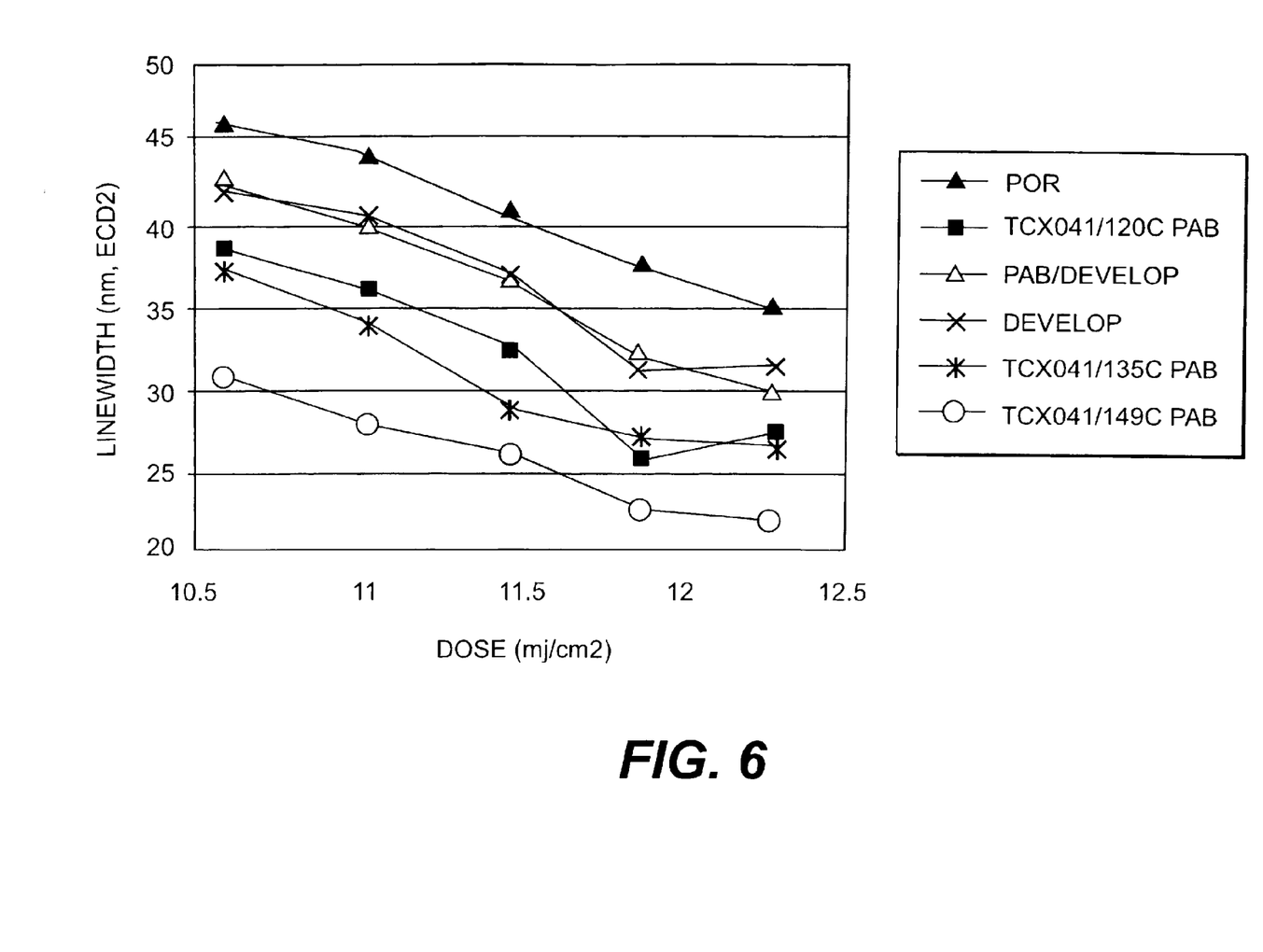
FIG. 6 comprises a graph characterizing the effect of bake temperature on the amount of line trim for JSR 2746 resist.

FIG. 6 plots data from procedures that generally follow the process described in FIG. 1 and comprises additional data for line-trim of polymer JSR2746 as the resist with three different bake temperatures for the TCX041 overcoat trim process, 120 C, 135 C, and 149 C, all for 60 sec bake time, and all with a 30 sec develop process. We use JSR 2746 in combination with SHB940 and ODL as described above with reference to FIG. 4. This resist is used under each of the top coats used in the trim process for the data reported in FIG. 6. The data show that with higher bake temperature, more trim is achieved, so the amount of trim can be adjusted as desired by adjusting bake temperature. The amount of line trim is observed to vary from about 7 nm with a 120 C bake to 15 nm with a 150 C bake, indicating that the amount of line trim can be selected as desired by adjusting the bake temperature. FIG. 6 also includes a data set for just an added develop, with no added bake or overcoat, and shows that for this resist some additional trim can be achieved with just the develop, but that more trim can be achieved by means of the overcoat.

The terms used for FIG. 6 are defined in FIG. 4. FIGS. 4, 5, and 6 all report data obtained using "−0.04 um focus," which refers to the focus setting in the expose tool for the exposure of the chip used to generate SEM data.

Figure 7:
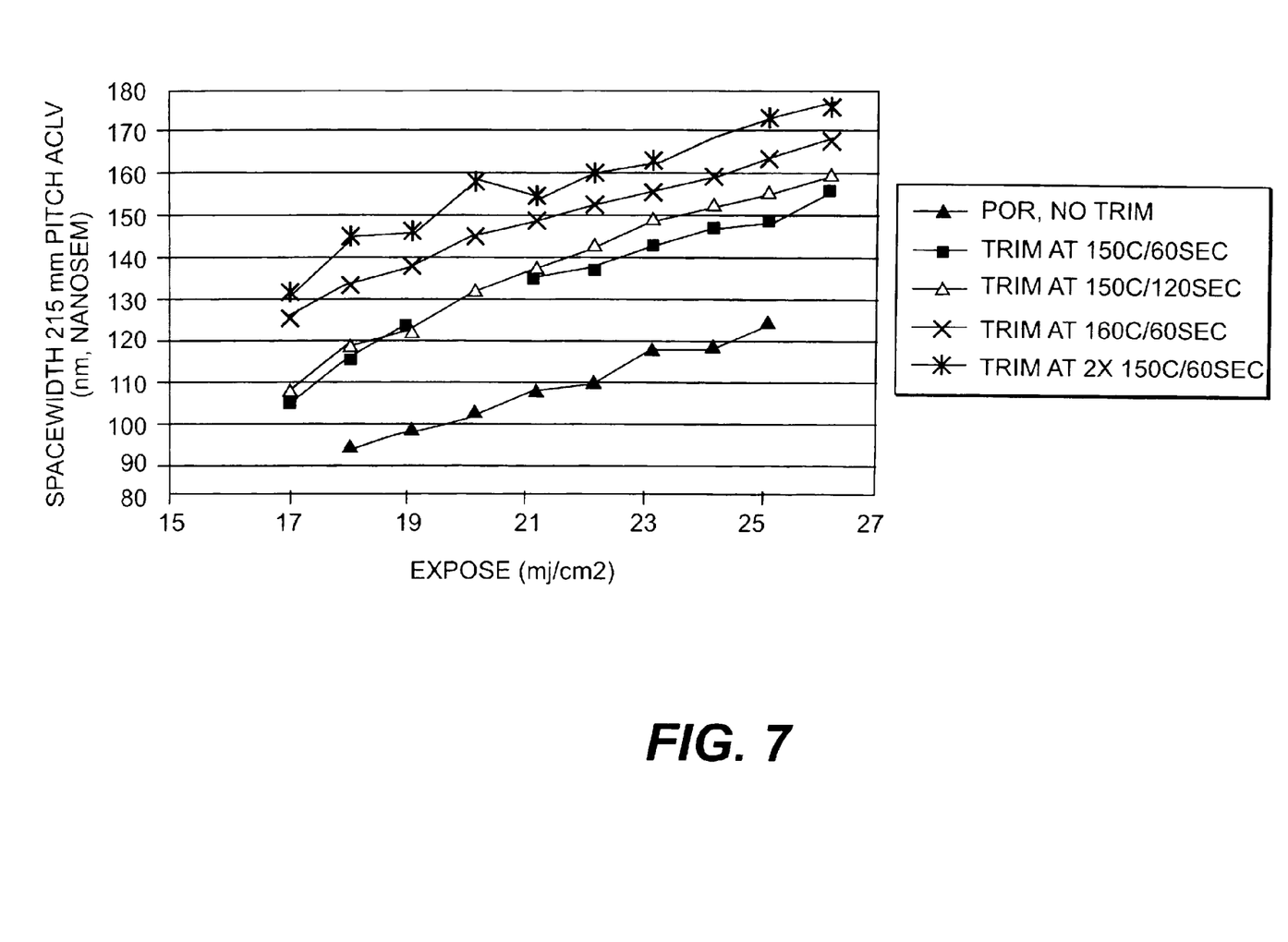
FIG. 7 comprises a graph that characterizes the increase in spacewidth for a range of trim processes, including extended bake times and repeated trim steps, for JSR 2073 resist.

The terms employed in FIG. 6 have the following meaning:
"POR" has the same meaning as above; standard litho stack with no extra processing, i.e., no trim steps;
"TCX041/120CPAB" Trim with TCX041 apply and 120 C PAB, followed by develop;
"PAB Develop" No TCX041 applied, only a bake at 149 C and a develop step;
"Develop" No TCX041 applied, and no extra bake, only an added develop step;
"TCXO41/135CPAB" TCX041 applied, with a 135 C bake, and followed by develop;
"TCXO41/149CPAB" TCX041 applied with a 149 C bake, and followed by develop;

FIG. 7 plots data from procedures that generally follow the process described in FIG. 1 and comprises some line-trim data to characterize the effect of increased bake time on the trim, as well as the effect of repeating the trim process a second time. In the case of bake time, a doubling of the bake time from 60 to 120 seconds provided minimal change in the trim amount, only about 2 nm additional trim. In contrast, the additional trim step added a similar amount of trim as the initial trim step.

These characteristics are of value because the trim appears to be self-limiting in the sense that after a specific amount of resist is converted in the bake process, the conversion stops, until a fresh overcoat layer is applied. The self-limiting nature of this process allows good control of the amount of the trim to be attained across a wafer, across pattern density factors and across pitch values.

In FIG. 7 "Spacewidth" is a measure of a resist space, rather than a resist line, "Nanosem" is a type of SEM tool used to make the measurement, made by applied materials. "TCX" refers to TCX041 defined previously whereas "ACLV" refers to a test structure used to characterize across chip linewidth variation, this test structure was measured for this experiment, the test structure had a 215 nm pitch, so line plus space equals 215 nm. "Eclipz RX" refers to an IBM test site for Eclipz 65 nm node technology, using a RX mask. The numerical aperture and illumination conditions are specified as for earlier figures, 1700i refers to the type of expose tool used. The data were obtained using a 193 nm expose system from AMSL that uses immersion technology. The resist coating under the TCX overlayer comprised a 2073/SiARC 940 ODL63 resist from JSR and previously described FIG. 7 plots data from experiments that compare the amount of trim vs. bake temperature, trim vs. bake time on the trim process, and trim vs. repetition of the trim process. The entry for 2× trim refers to the fact that the entire trim process was performed twice on that wafer, i.e., applying a coat of TCX041, baking at 150 C and developing for 30 sec. Interestingly, 2× trim gave about twice the amount of trim, whereas a doubling of the bake time from 60 sec to 120 sec did not provide more trim, indicating that the chemical interaction between the overcoat and the resist reaches a limit and then stops. If more trim is desired, one needs to increase the repetitions of the trim, or increase the bake temperature for the trim.

We define the following terms used in FIG. 7 as follows:
"POR, No Trim" A standard litho stack of organic underlayer at 200 nm, silicon antireflective layer at 80 nm, and JSR 2073 resist at 200 nm thickness)
"Trim at 150 C/60 sec" The same litho stack as in POR, but, after expose and develop, add steps of coating TCX041 at 90 nm, baking at 150 C for 60 seconds, and develop for 30 seconds.
"Trim at 150 C/120" The same litho stack as in POR, but, after expose and develop, add steps of coating TCX041 at 90 nm, baking at 150 C for 120 seconds, and develop for 30 seconds.
"Trim at 160 C/60 sec" The same litho stack as in POR, but, after expose and develop, add steps of coating TCX041 at 90 nm, baking at 160 C for 60 seconds, and develop for 30 seconds.
"Trim at 2×150 C/60 sec" The same litho stack as in POR, but, after expose and develop, add steps of coating TCX041 at 90 nm, baking at 150 C for 60 seconds, and develop for 30 seconds, and then repeat this trim process again, coating TCX041, baking at 150 C for 60 seconds, and developing, so the trim is done twice.

Figure 8:
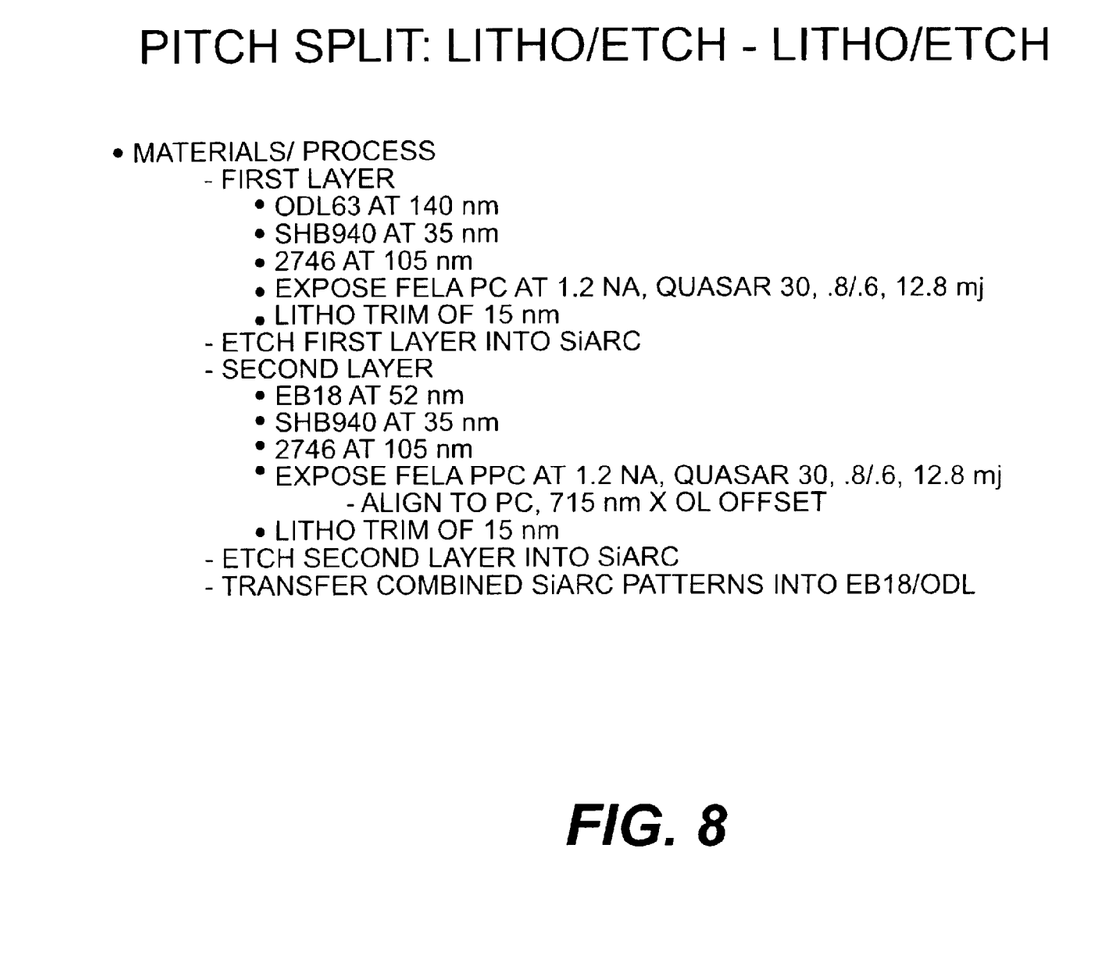
FIG. 8 comprises a flow diagram for Pitch Split patterning.

FIG. 8 comprises a process flow using our line-trim process to enable a pitch-split application for the fabrication of 65 nm pitch feature types with a 193 nm exposure wavelength patterning system. In this flow, a first patterned layer is formed in resist, trimmed with our process to achieve a 30 nm line at a 130 nm pitch. This pattern is etched into a silicon-containing anti-reflective coating layer, which the resist layer is consumed. A second lithographic stack is applied over the etched pattern, and the exposure with trim is repeated. The second layer is etched into the silicon ARC, and down through the organic underlayer, and then the two combined patterns are finally etched into the silicon substrate together in order to create the final pattern at 65 nm pitch. The line-trim process is an enabling element of this sequence, as it allows the narrow 30 nm resist lines to be patterned with sufficient process window.

As described above, we spin apply our resist stack, composed of, for the first layer of the pitch split process, of ODL 63 at 140 nm (250 C/90 sec post apply bake), followed by 35 nm of SHB940 (180 C/60 sec post apply bake), and then JSR 2746 resist at 105 nm (110 C/60 sec post apply bake), we also applied 90 nm of TXC041 as an immersion top coat over the resist prior to expose (90 C/60 sec post apply bake). We performed an immersion expose of a 130 nm Pitch structure at 1.2 NA, Quasar30 illuminator, 0.8/0.6 outer/inner aperture for the illuminator, using a 1700i 193 nm exposure tool from ASML. After resist develop, the pattern is etched into the SHB940 silicon ARC layer by means of fluorine/oxygen RIE. The resist is consumed during this etch process.

After the etch, a second lithography step is performed, aligning to the first layer. In this case, we used EB18 BARC (manufactured by AZ corporation) rather than ODL63 (manufactured by Shin-Etsu Chemical Co. Ltd.). Both of these are dyed organic polymers, optimized to minimize reflectivity. They are well known in the art and are commercially available. The EB18 was coated at 52 nm with a 200 C/60 sec PAB. Then, SHB940 SiARC was coated over the EB18, and finally, a second resist layer of JSR 2746, and TCX041 topcoat, same as for the first lithographic stack. The second resist layer is exposed, same as first layer, developed, and the resist pattern is transferred into the SHB940 in the same way as the first layer. The second resist layer is etched through the EB18, using the SiARC as an etch mask, and then the combined SiARC patterns of the two lithographic layers are transferred into the ODL underlayer, to create the final pitch split pattern. The ODL is etched with oxygen RIE.

Figure 9:
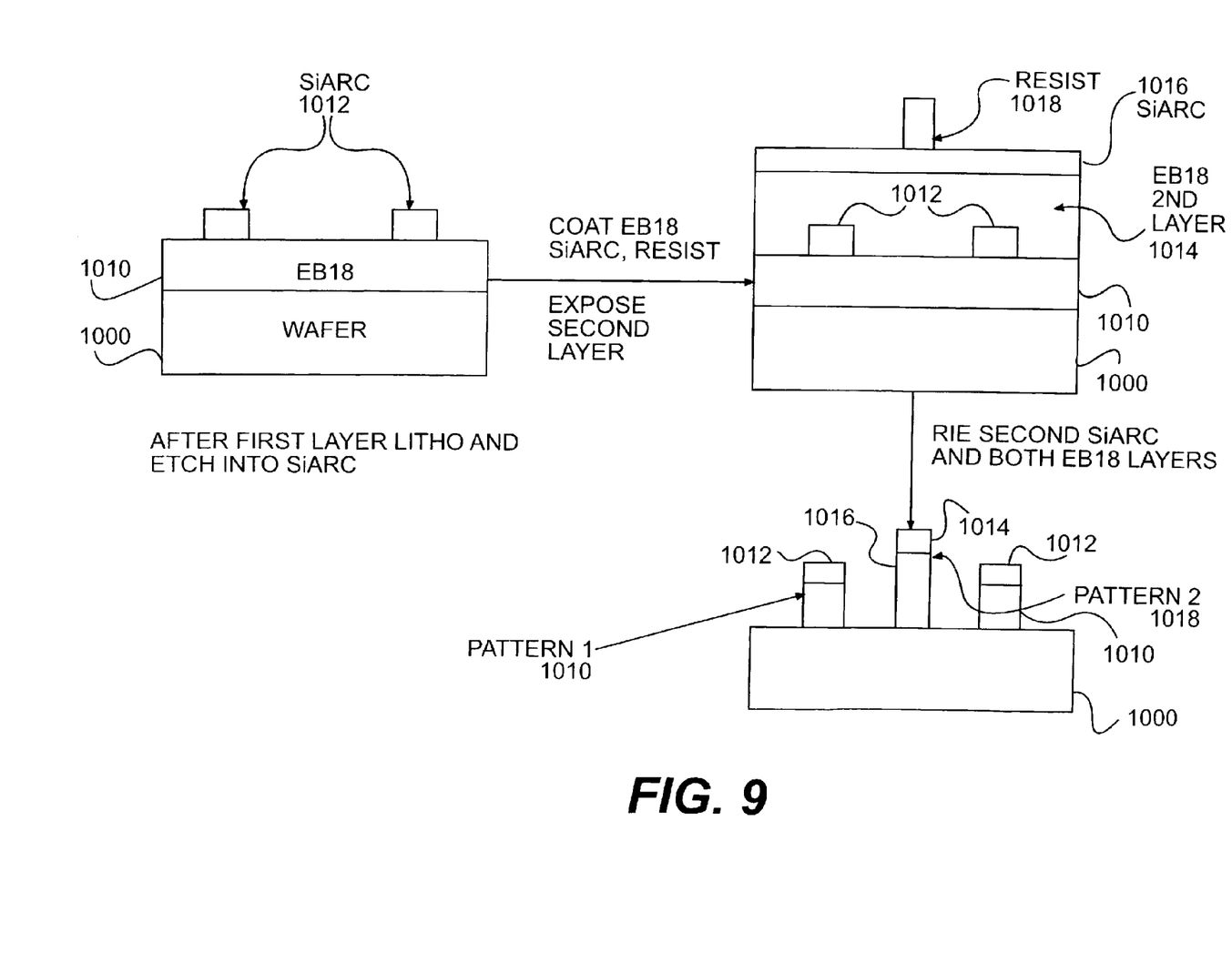
FIG. 9 comprises a Cross-Section schematic for pitch split patterning.

FIG. 9 comprises a schematic diagram of the process flow described in FIG. 8. In FIG. 9 SiARC is SHB940, described above, RIE uses fluorine/oxygen chemistry to etch SiARC, and oxygen RIE to etch EB18 and ODL63. The process illustrated in FIG. 9 comprises a pitch split with a SiARC memory layer and shows a silicon wafer 1000 with an EB18 layer 1010 and a SiARC pattern comprising linewidth elements 1012. We subsequently apply a second EB 18 layer 1014 over elements 1012 and layer 1010 followed by a subsequent application of a SiARC layer 1016 and a resist 1018. Applying a RIE to the second SiARC layer 1016 and both EB 18 layers1010 and 1014 results in the production of a device showing pattern 1 and pattern 2 as previously described.

Figure 10:
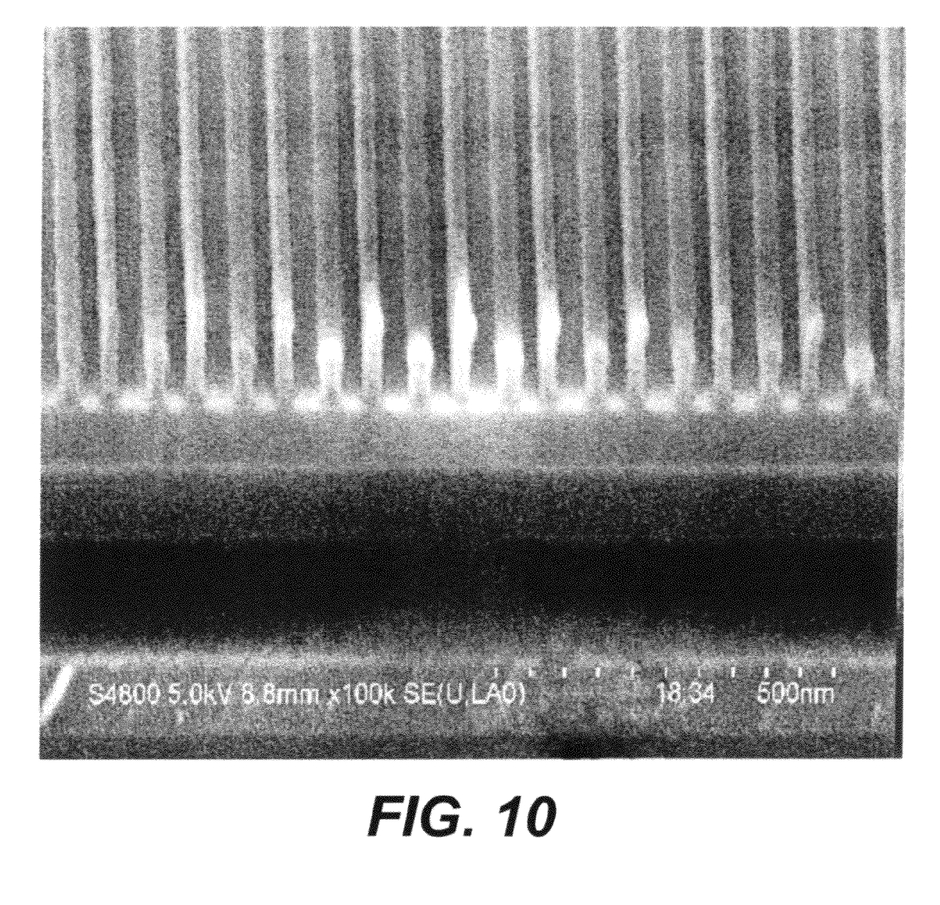
FIG. 10 comprises a SEM cross-section of a pitch split pattern.

FIG. 10 comprises a SEM cross-section of an embodiment of this process flow, after etch through the organic underlayer of the lithographic stack, showing the 65 nm pitch has been achieved. FIG. 10 illustrates a LELE pitch split, Fela PC, 65 nm effective pitch 2746/SHB940/EB18 stack for both mask patterns using the process and components described previously in FIGS. 8 and 9. LELE refers to litho/etch/litho/etch described in FIGS. 9 and 10 which, again, was the process scheme used. The resist stack is as described above.

Figure 11:
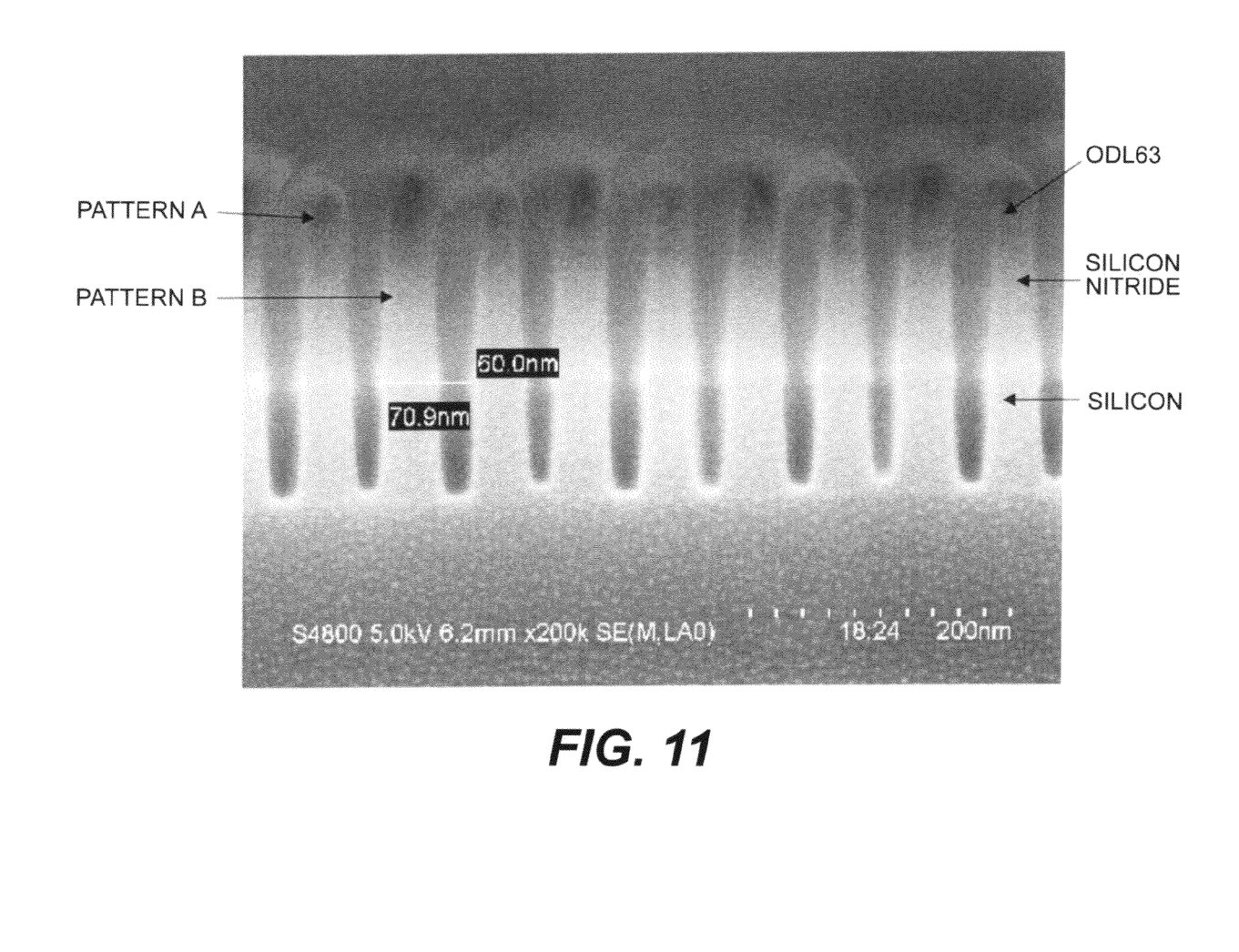
FIG. 11 comprises a SEM cross-section of pitch split pattern etched into a silicon wafer.

FIG. 11 comprises a SEM cross-section of this 65 nm pitch-split pattern of FIG. 10 after etch transfer into a silicon substrate, showing that this pattern can be used to fabricate structures in silicon. In FIG. 11, the etch chemistry for nitride is fluorine RIE, and the silicon etch is chlorine RIE.

"Pattern A" and "Pattern B" in FIG. 11 correspond to "Pattern 1" and "Pattern 2" in FIG. 9 and "Pattern 1" and "Pattern 2" in FIG. 9 correspond to the "first layer" and "second layer" of FIG. 8.

Throughout this specification, abstract of the disclosure, and in the drawings the inventors have set out equivalents, including without limitation, equivalent elements, materials, compounds, moieties, substituents, compositions, conditions, processes, structures and the like, and even though set out individually, also include combinations of these equivalents such as the two component, three component, or four component combinations, or more as well as combinations of such equivalent elements, materials, compounds, moieties, substituents, compositions conditions, processes, structures and the like in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about," "substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a miniscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, or the written description, specification, claims, drawings, and abstract of the disclosure as subsequently amended, as the case may be.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following claims, abstract of the disclosure, and appended drawings.

We claim:

1. A product made by a lithographic line-trim process for reducing the linewidth of an image on a substrate while maintaining the lithographic process window, comprising the steps of:
   (a) applying a lithographic resist layer on a surface of a substrate and patterning and developing said lithographic resist layer to form a nm order node image having an initial linewidth;
   (b) overcoating said nm order node image with an acidic polymer to produce an acidic polymer coated image;
   (c) heating said acidic polymer coated image to produce a heat treated coating on said image, said heating being conducted at a temperature and for a time sufficient to reduce said initial linewidth to a subsequent narrowed linewidth; and
   (d) developing said heat treated coating to remove said acidic polymer and produce a free-standing trimmed lithographic feature on said substrate;
   (e) wherein said substrate is operatively associated with a hard mask material and said image comprises a first lithographic layer operatively associated with said hard mask material, and etching said first lithographic layer into said hard mask material and repeating said steps (a) to (d) to apply a second lithographic layer in a manner to form a pitch-split pattern on said substrate;
   said line-trim process producing a focus/expose process window having an expose latitude greater than the expose latitude obtained with an overexpose process.

2. The product of claim 1 wherein said substrate comprises a surface of a semiconductor device.

3. The product of claim 1 wherein said heating is conducted at a temperature of from about 60° to about 250° C.

4. The product of claim 1 wherein said heating is conducted at a temperature of from about 120° to about 150° C.

5. A product produced by the process of forming a nm order node image according to claim 1 wherein said lithographic resist layer comprises a first lithographic resist layer, followed by repeating said steps (a) to (d) to apply a second lithographic resist layer in a manner to form a pitch-split image, wherein said process excludes an etching step.

6. A product produced by the process of forming a nm order node image according to the process of claim 1 wherein said lithographic resist layer comprises a first lithographic resist layer, followed by repeating said steps (a) to (d) to apply a second lithographic resist layer dissolved in a solvent comprising at least one alkanol having 1 to about six carbon atoms, said second lithographic resist layer being applied in a manner to form a pitch-split image, wherein said process excludes an etching step.

7. A product produced by the process of claim 1 wherein at least one of said acidic polymer or said lithographic resist layer comprises acidity enhancing electron withdrawing groups.

8. The product of claim 7 wherein at least one of said acidic polymer or said lithographic resist layer further comprises a sulfur-containing acidic moiety.

9. The product of claim 7 wherein at least one of said acidic polymer or said lithographic resist layer has an ethylenic backbone.

10. The product of claim 9 wherein at least one of said acidic polymer or said lithographic resist layer comprises monomeric units selected from vinyl, or acrylates, or methacrylates and combinations thereof.

11. The product of claim 9 wherein at least one of said acidic polymer or said lithographic resist layer includes at least one monomeric unit having a structure selected from:

wherein R is Cl, F, Br, I, $CCl_3$, $CF_3$, $CBr_3$, CN, NO, or $NO_2$.

12. The product of claim 7 wherein at least one of said acidic polymer or said lithographic resist layer further comprises a halogen, cyano, or nitro-containing carboxylic acid moiety.

13. The product of claim 7 wherein at least one of said acidic polymer or said lithographic resist layer includes at least one monomeric unit having the following structure:

wherein R is Cl, F, Br, I, $CCl_3$, $CF_3$, $CBr_3$, CN, NO, or $NO_2$.

14. The product of claim 1 wherein said acidic polymer is tuned to said resist so that the acidic properties of said acidic polymer sufficiently cleave active sites on said resist during said heating of said acidic polymer to provide significant reduction of said linewidth without inducing excessive linewidth reduction of said nm order node image.

* * * * *